(12) United States Patent
Wang et al.

(10) Patent No.: US 6,882,534 B2
(45) Date of Patent: Apr. 19, 2005

(54) FASTENING DEVICE FOR HEAT SLUG

(75) Inventors: Jack Wang, Taoyuan (TW); Cheng-Hua Cheng, Taoyuan (TW); Michael Lin, Taoyuan (TW); Charles Ma, Taoyuan (TW)

(73) Assignee: Waffer Tech. Co., Taipei (TW)

( * ) Notice: Subject to any disclaimer, the term of this patent is extended or adjusted under 35 U.S.C. 154(b) by 123 days.

(21) Appl. No.: 10/336,714

(22) Filed: Jan. 6, 2003

(65) Prior Publication Data

US 2004/0130875 A1 Jul. 8, 2004

(51) Int. Cl.⁷ ................................................. H05K 7/20
(52) U.S. Cl. ....................... 361/704; 24/510; 165/80.3; 165/185; 257/719; 248/510; 361/710; 361/707
(58) Field of Search ............................... 165/80.2, 80.3; 174/16.3; 257/718–719, 726–727; 361/704–721; 24/457–459, 295–296; 248/505, 510

(56) References Cited

U.S. PATENT DOCUMENTS 6,160,709 A * 12/2000 Li ............................... 361/704

* cited by examiner

*Primary Examiner*—Gregory Thompson

(57) ABSTRACT

A fastening device for heat slug includes a frame, two projections and a heat slug. The frame defines an accommodating space therein. The projections are formed on the frame. The heat slug has a plurality of shoulders and is located in the accommodating space. The frame abuts against the shoulders of the heat slug. Thereby the fastening device of the invention is compatible with different types of CPU such as Pentium IV and K7 types.

11 Claims, 6 Drawing Sheets

FASTENING DEVICE FOR HEAT SLUG

BACKGROUND OF THE INVENTION

1. Field of the Invention

The invention relates to a fastening device for heat slug and, more particularly, to a fastening device for heat slug that is compatible with different types of CUP such as "Pentium IV" or "K7" types.

2. Description of the Related Art

As the fabrication techniques of computer progresses, a central processor unit (CPU) of the computer becomes increasingly smaller, and the amount of heat generated from the CPU is increasingly higher. In order to achieve an effective heat dissipation, a heat slug is usually attached on the CPU, which contributes to increase the service life and performance of the CPU.

The heat slug is usually formed by aluminum injection molding, pressure die casting or folding. A heat slug formed by either aluminum injection molding or pressure die casting has limited effective heat dissipating density (i.e. total heat dissipating area per volume) due to the capability of the mechanical process. As the processing speed of the CPU becomes higher, a heat slug-formed by folding, which has a higher effective heat dissipating density, becomes more popular than the heat slug formed by aluminum injection molding or pressure die casting.

CPUs of current generation generally include Pentium IV type CPUs designed by Intel, and K7 series CPU designed by AMD. Conventionally, a heat slug of the Pentium IV CPU is fastened on a mother board through a particular receiving base. A heat slug of K7 series CPU is fastened on the mother board without the need of any receiving bases. Therefore, no single heat slug can be used with both Pentium IV CPU and K7 series CPU.

SUMMARY OF THE INVENTION

It is therefore a principal object of the invention to provide a fastening device that is compatible with Pentium IV and K7 types CPUs, which lowers the required production cost.

To accomplish the above and other objectives, a fastening device for heat slug includes a frame, two projections and a heat slug. The frame defines an accommodating space therein. The projections are formed on the frame. The heat slug has a plurality of shoulders and is located in the accommodating space. The frame abuts against the shoulders of the heat slug. Thereby the fastening device of the invention is compatible with different types of CPUs such as Pentium IV and K7 types.

To provide a further understanding of the invention, the following detailed description illustrates embodiments and examples of the invention, this detailed description being provided only for illustration of the invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

Figure 1:
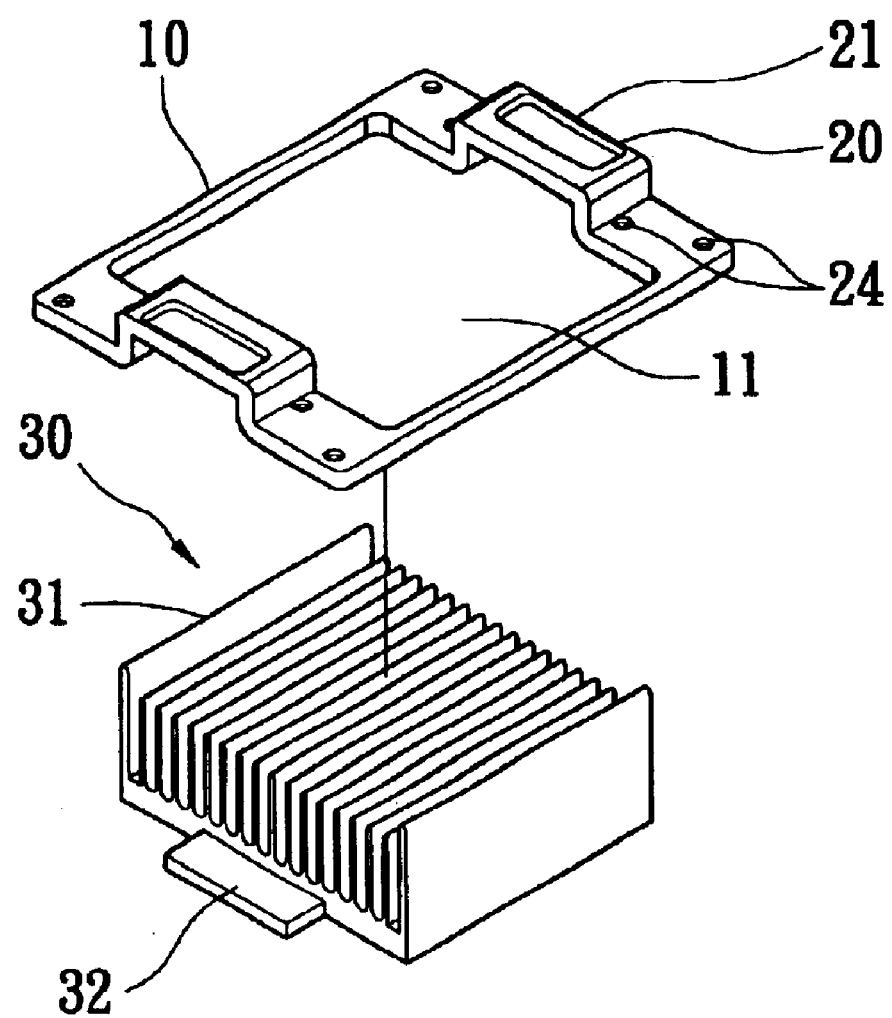
FIG. 1 is an exploded view of a fastening device for a heat slug according to one embodiment of the invention.

Wherever possible in the following description, like reference numerals will refer to like elements and parts unless otherwise illustrated.

Referring to FIG. 1, the invention provides a fastening device for heat slug. The fastening device includes a frame 10, two projections 20 and a heat slug 30. The frame 10 is a hollow frame having a generally square shape with an accommodating space 11. The frame 10 is made of, for example, metal (other materials may also be suitable). A size of the frame 10 is slightly smaller than a receiving base 80 of a central processor unit of the type Pentium IV (as FIG. 2 and FIG. 3) to receive the frame 10 therein.

The projections 20 are made of, for example, metal. The projections 20 are either separately or integrally formed at two opposite sides of the frame 10. In this embodiment, the projections 20 are integrally formed with the frame 10. Each projection 20 has a reverse U-shaped boss 21. A plurality of fastening holes 24 are adequately distributed close to each projection 20.

Figure 6:
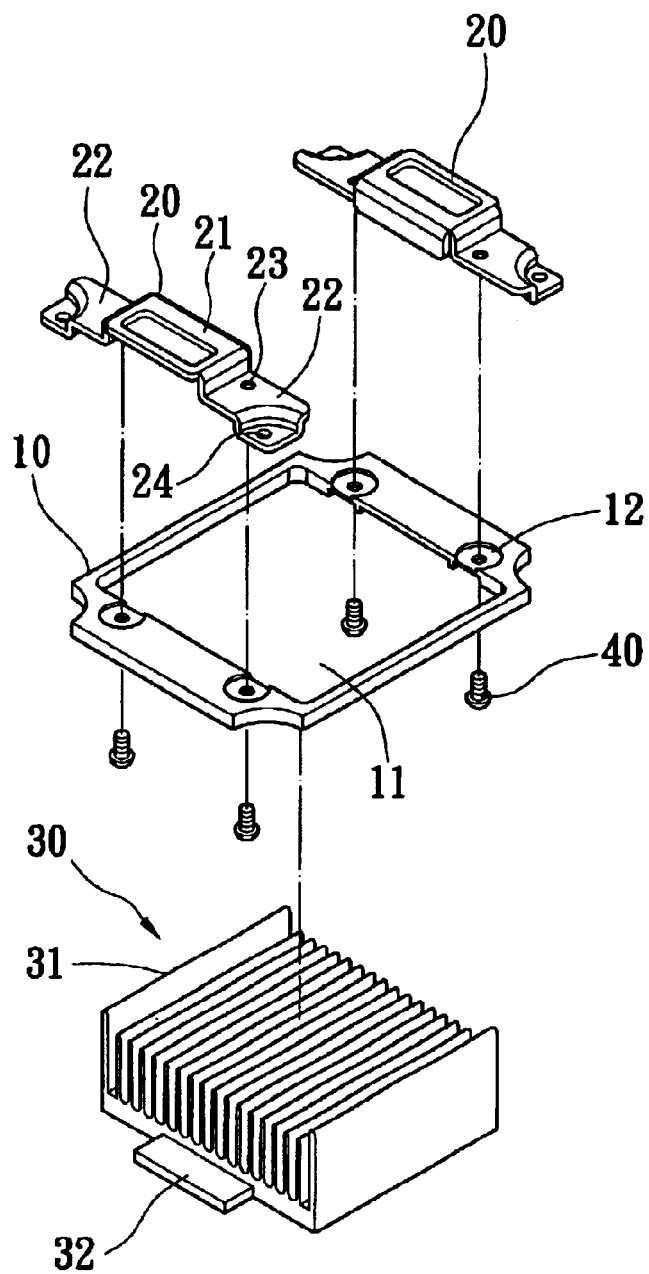
FIG. 6 is an exploded view of a fastening device for heat slug according to a third embodiment of the invention.

In another embodiment, the projection 20 is separately formed with the frame 10, as shown in FIG. 6. A plurality of first connecting holes 12 are formed at opposite sides of the frame 10. Two wings 22 oppositely extend from ends of the projection 20. Each wing 22 has a second connecting hole 23 corresponding to the first connecting hole 12 for a screw 40 to penetrating there through. Thereby, the projections 20 are screwed to the frame 10. The fastening holes 24 are formed at tip portions of the wings 22. It should be noted that the projections 20 optionally protrude from the frame 10 depending on whether peripheral devices may interfere with the fastening device.

The heat slug 30 is made of a thermally conductive material. The heat slug 30 has a plurality of fins 31 to increase the heat dissipating area. The heat slug 30 has two shoulders 32 at opposite bottom sides. The shoulders 32 can be either separately or integrally formed with the heat slug 30. The type and shape of the heat slug 30 may be various and not limited to the illustrated embodiment. The heat slug 30 is arranged in the accommodating space 11 in such a manner that the fins 31 of the heat slug 30 protrude through a top of the frame 10 with an adequate height and a bottom of the frame 10 abuts against the shoulders 32. Thereby, the fastening device for heat slug of the invention is accomplished.

Figure 2:
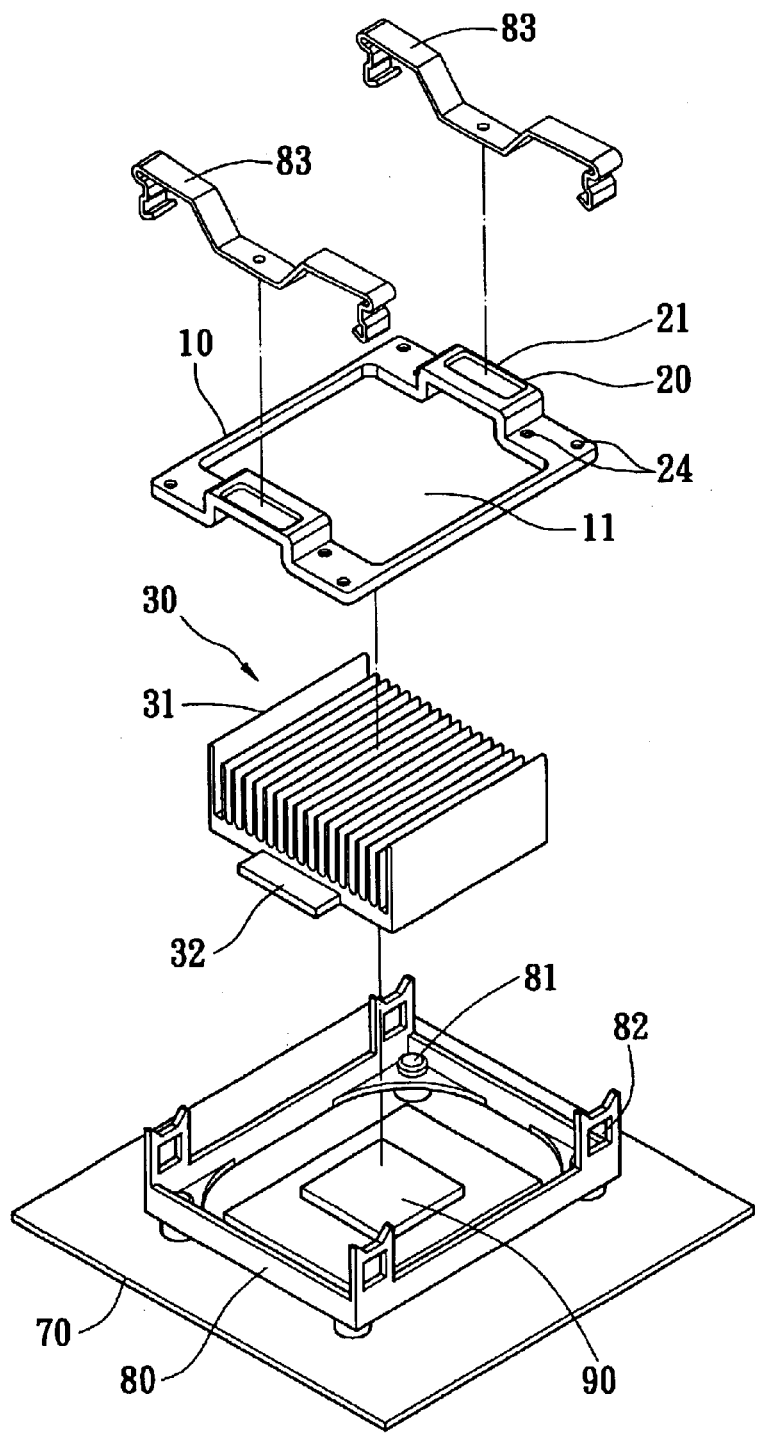
FIG. 2 is an exploded view of a fastening device assembled according to a first embodiment of the invention.
Figure 3:
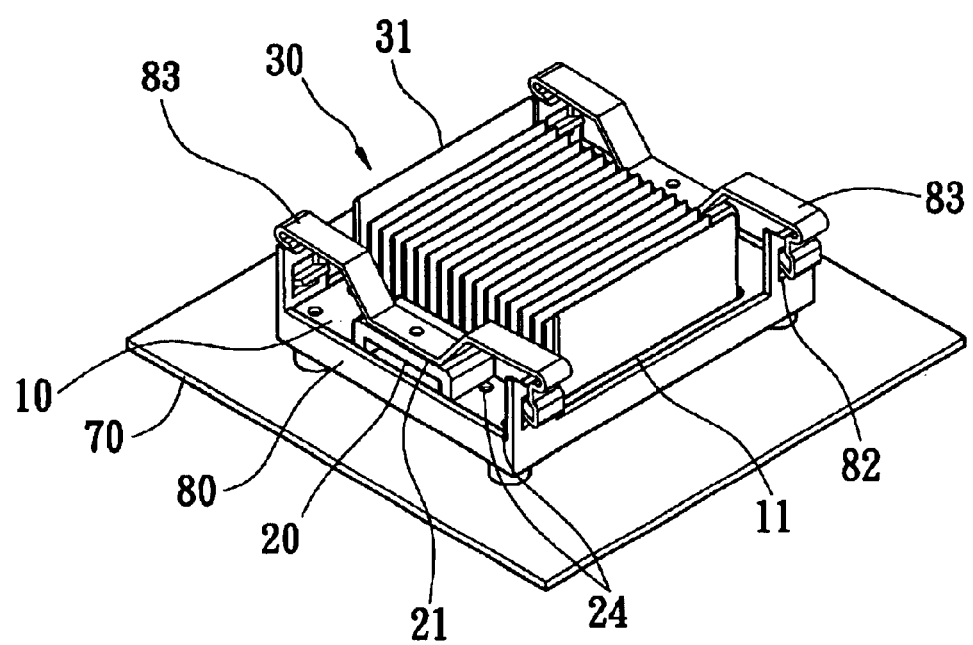
FIG. 3 is a perspective view of an assembled fastening device for heat slug according to the first embodiment of the invention.

Referring to FIG. 2 and FIG. 3, when the fastening device for heat slug of the invention is assembled with a Pentium IV CPU 90, the heat slug 30 is mounted on the CPU 90 enclosed by a receiving base 80. The receiving base 80 is fastened to a mother board 70 by a rivet 81. The receiving base 80 has a plurality of clamping holes 82 for fastening with resilient clamps 83. Thereby, the frame 10 and the heat slug 30 inside the frame 10 are accommodated in the receiving base 80, with the bottom of the heat slug 30 contacting with a top of the CPU 90. Then, two ends of each resilient clamp 83 respectively insert through the corresponding clamping holes 82 to attach to the receiving base 80 in such a manner that the clamps 83 resiliently abut against the bosses 21 of the projections 20. The frame 10 and the projections 20 are thereby firmly fastened on the mother board 70. Furthermore, by abutting the bottom of the frame 10 against the shoulders 32 of the heat slug 30, the bottom of the heat slug 30 is firmly attached on the top of the CUP 90 to increase heat dissipation effects. Therefore, the service life and the performance of the CUP are significantly improved.

When the fastening device for heat slug of the invention is used with the Pentium IV type CPU 90, the CPU alternatively may be fastened through part of the fastening holes 24 without using the receiving base 80 for enclosing the CUP 90.

Figure 4:
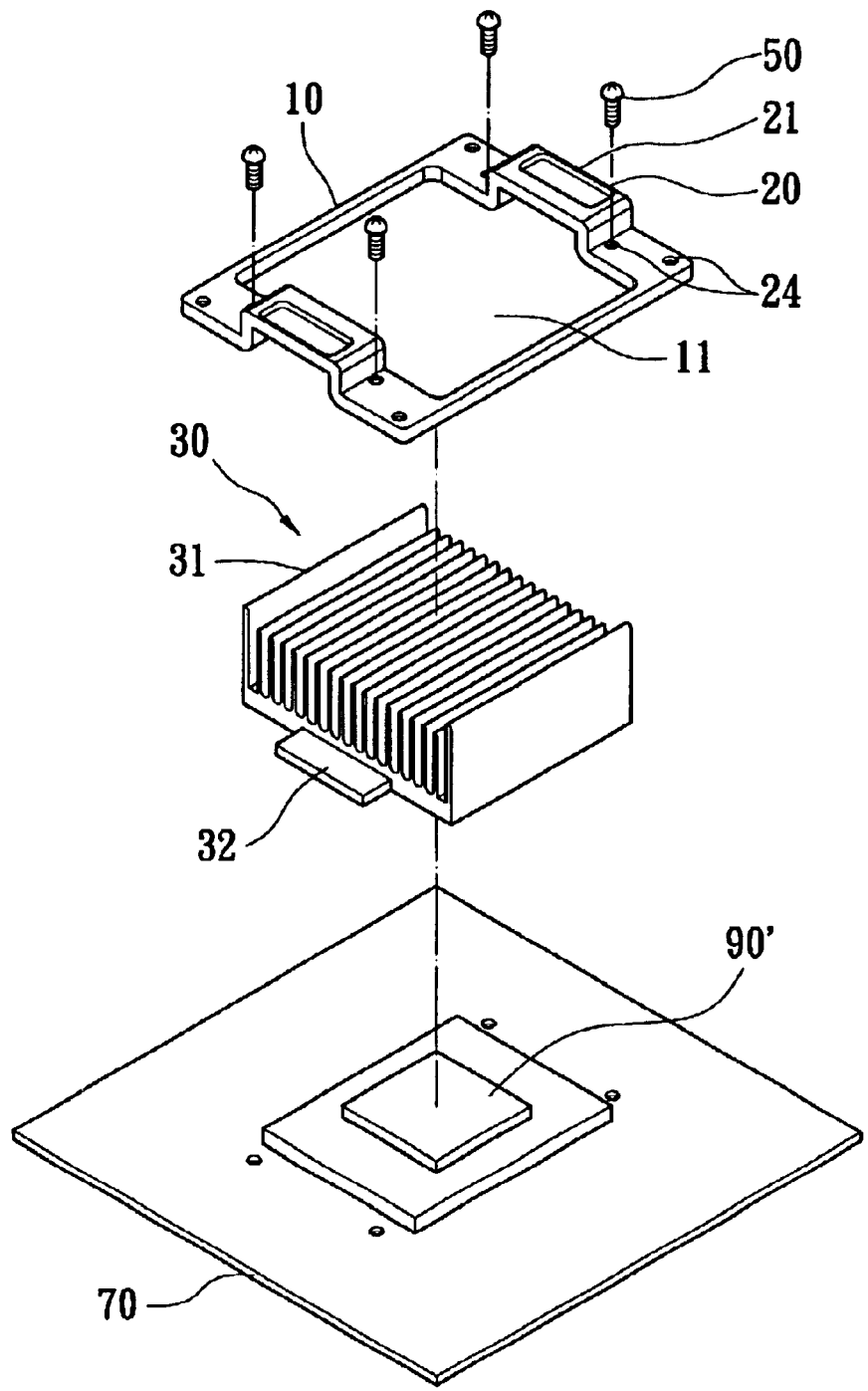
FIG. 4 is an exploded view of a fastening device for heat slug assembled according to a second embodiment of the invention.
Figure 5:
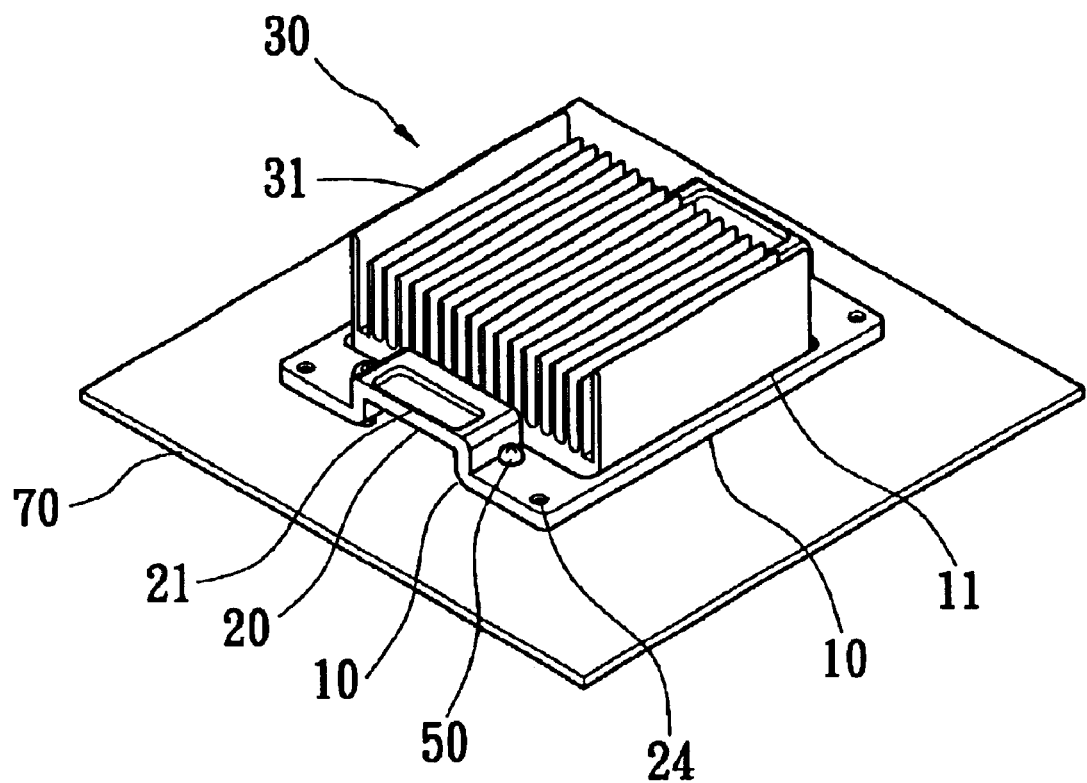
FIG. 5 is a perspective view of an assembled fastening device for heat slug according to the second embodiment of the invention.

Referring to FIG. 4 and FIG. 5, when the fastening device for heat slug of the invention is used with a K7 series type CPU 90', no receiving base is needed to enclose the CUP 90'. The frame 10 and the heat slug 30 located inside the frame 10 can be directly mounted on the mother board 70 to have the bottom of the heat slug 30 contact with a top of the CPU 90'. Then, the frame 10 and the projections 20 are fastened with the mother board 70 by inserting at least a screw 50 through its corresponding fastening hole. Furthermore, by abutting the bottom of the frame 10 against the shoulders 32 of the heat slug 30, the bottom of the heat slug 30 is firmly attached on the top of the CUP 90' to increase heat dissipation effects. The service life and the performance of the CUP are thereby effectively improved.

The fastening device for heat slug of the invention can be used in CPU of various types such as Pentium IV and K7 as described above. Therefore, a manufacturer of the fastening device of the invention does not need to separately design specific devices for Pentium IV and K7. In other words, the fastening device of the invention is highly compatible with different types of CPU, which advantageously lowers the production cost.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A fastening device for heat slug, comprising:
 a frame, defining an accommodating space therein;
 two projections, separately assembled on the frame; and
 a heat slug, having a plurality of shoulders, wherein the heat slug is located in the accommodating space of the frame, and the frame abuts against the shoulders of the heat slug.

2. The fastening device of claim 1, wherein the frame and the two projections are respectively made of metal.

3. The fastening device of claim 1, wherein the two projections are integrally formed with the frame.

4. The fastening device of claim 1, wherein the frame has a first connecting hole and each projection has a boss, and two wings oppositely extend from ends of each projection, each wing having a second connecting hole that corresponds to the first connecting hole for a screw to penetrating there through in order to screw the projections to the frame.

5. The fastening device of claim 1, wherein the projections are mounted at opposite sides of the frame.

6. The fastening device of claim 1, wherein the shoulders oppositely abut against a bottom of the heat slug.

7. The fastening device of claim 1, wherein the heat slug has a plurality of fins protruded through a top of the frame.

8. The fastening device of claim 1, wherein
 the heat slug is mounted on a CPU that is enclosed in a receiving base having a plurality of clamping holes;
 the frame and the heat slug being accommodated in the receiving base in a manner to have the bottom of the heat slug contact with a top of the CPU;
 ends of two resilient clamps respectively inserting through the corresponding clamping holes of the recieving base for attachment to oppisite sides of the recieving base in a manner that the clamps resiliently abut against bosses of the projections to firmly fasten the frame and the projections on a mother board; and
 by abutting the bottom of the frame against the shoulders of the heat slug, the bottom of the heat slug is firmly attached on the top of the CPU.

9. The fastening device of claim 1, wherein the heat slug is mounted on a CPU;
 the frame and the heat slug are mounted on the mother board to have a bottom of the heat slug contact with the CPU;
 the frame and the projections are fastened on the mother board by inserting a screw through the frame; and
 by abutting the bottom of the frame against the shoulders of the heat slug, the bottom of the heat slug is firmly attached on the top of the CPU.

10. A fastening device for a heat slug, comprising:
 a frame defining an accommodating space therein;
 two projections extending upwardly from said frame; and
 a heat slug having a plurality of shoulders, wherein the heat slug is located in the accommodating space of the frame, and the frame abuts against the shoulders of the heat slug;
 wherein each projection has a plurality of fastening holes.

11. A fastening device for a heat slug, comprising:
 a frame defining an accommodating space therein;
 two projections extending upwardly from said frame; and
 a heat slug having a plurality of shoulders, wherein the heat slug is located in the accommodating space of the frame, and the frame abuts against the shoulders of the heat slug;
 wherein a plurality of fastening holes are formed on opposite sides of each projection.

* * * * *